United States Patent
Kervaon et al.

(10) Patent No.: US 7,816,991 B2
(45) Date of Patent: Oct. 19, 2010

(54) SIGNAL SPLITTER

(75) Inventors: Thibault Philippe Paul Kervaon, Colombelles (FR); Sebastien Amiot, Bieville-Beuville (FR)

(73) Assignee: NXP B.V., Eindhoven (NL)

( * ) Notice: Subject to any disclaimer, the term of this patent is extended or adjusted under 35 U.S.C. 154(b) by 217 days.

(21) Appl. No.: 11/575,489

(22) PCT Filed: Sep. 8, 2005

(86) PCT No.: PCT/IB2005/052942

§ 371 (c)(1),
(2), (4) Date: Apr. 30, 2008

(87) PCT Pub. No.: WO2006/030358

PCT Pub. Date: Mar. 23, 2006

(65) Prior Publication Data

US 2009/0206906 A1    Aug. 20, 2009

(30) Foreign Application Priority Data

Sep. 16, 2004  (EP) ................... 04300601

(51) Int. Cl.
*H03G 3/30* (2006.01)
(52) U.S. Cl. ..................... 330/279; 330/282; 330/311
(58) Field of Classification Search .................. 330/254, 330/278, 283, 301, 311
See application file for complete search history.

(56) References Cited

U.S. PATENT DOCUMENTS

| | | | |
|---|---|---|---|
| 4,404,527 A | 9/1983 | Schertz et al. | |
| 5,184,088 A | 2/1993 | Craft | |
| 5,331,290 A | 7/1994 | Harford et al. | |
| 6,049,251 A * | 4/2000 | Meyer | 330/254 |
| 6,600,371 B2 * | 7/2003 | Cali | 330/254 |
| 2003/0001675 A1 | 1/2003 | Costa et al. | |

* cited by examiner

*Primary Examiner*—Khanh V Nguyen

(57) ABSTRACT

A controllable-gain circuit (TI, Rt, TS1, ..., TS4) provides a first and a second pair of complementary gain-controlled signals (Ip1, Ip3; Ip2, Ip4) in response to an input signal (RFI). In each pair, one gain-controlled signal (Ip1, Ip2) is the input signal amplified with a gain G comprised in a range between a minimum gain Gmin and a maximum gain Gmax. The other gain-controlled signal (Ip3, Ip4) is the input signal amplified with complementary gain Gmax-G. A fixed-gain output circuit (Rfg, Nfg) makes a weighed sum (Ip1*Rfg+Ip3*Rfg) of one and the other gain-controlled signal in the first pair of complementary gain-controlled signals. The respective weighing factors for one and the other gain-controlled signal are substantially similar (Rfg). A controllable-gain output circuit (Rlg, Rhg, Nlg, Nhg) makes a weighed sum (Ip2*Rlg+Ip4*(Rlg+Rhg)) of one and the other gaincontrolled signal in the second pair of complementary gain-controlled signals. The respective weighing factors for one and the other gain-controlled signal are substantially different (Rlg, Rlg+Rhg).

9 Claims, 2 Drawing Sheets

SIGNAL SPLITTER

FIELD OF THE INVENTION

An aspect of the invention relates to a signal splitter. The signal splitter arrangement may be utilized in, for example, an input section of a receiver so as to "loop-through" an input signal to another receiver. Other aspects of the invention relate to a method of splitting a signal, a signal processing arrangement and an information-recording apparatus. The information-recording apparatus may be, for example, a digital versatile disk (DVD) recorder or a hard disk drive (HDD) recorder, or a combination of both.

BACKGROUND OF THE INVENTION

U.S. Pat. No. 5,706,060 describes a video recorder with an antenna input and an antenna output. A television receiver is connected to the antenna output of the video recorder. The video recorder has an RF receiving section that receives an antenna signal via the antenna input. The RF receiving section includes a wideband amplifier and inductances that constitute a signal path in which the antenna signal is looped through to the television receiver. The antenna signal is simultaneously amplified when the video recorder is switched on.

SUMMARY OF THE INVENTION

According to an aspect of the invention, a signal splitter has the following characteristics. A controllable-gain circuit provides a first and a second pair of complementary gain-controlled signals in response to an input signal. In each pair, one gain-controlled signal is the input signal amplified with a gain G comprised in a range between a minimum gain Gmin and a maximum gain Gmax. The other gain-controlled signal is the input signal amplified with complementary gain Gmax-G. A constant-gain output circuit makes a weighed sum of one and the other gain-controlled signal in the first pair of complementary gain-controlled signals. The respective weighing factors for one and the other gain-controlled signal are substantially similar. A controllable-gain output circuit makes a weighed sum of one and the other gain-controlled signal in the second pair of complementary gain-controlled signals. The respective weighing factors for one and the other gain-controlled signal are substantially different.

The invention takes the following aspects into consideration. The insertion of a signal splitter in a signal processing chain generally has an adverse effect on signal-to-noise ratio. This is particularly true if the signal splitter is inserted in the front-end of the signal processing chain. An amplifier may be coupled in front of the signal splitter in order to reduce the adverse effect on signal-to-noise ratio. However, in that case, signal processing stages that are behind the amplifier will receive stronger signals. This generally has an adverse effect on signal-to-distortion ratio. A compromise between signal-to-noise ratio and signal-to-distortion ratio needs to be made.

The compromise can be better if the amplifier has a controllable gain. In case only one or more small signals are present at an input, the amplifier is controlled so as to provide a relatively high gain. In that case, the signal processing chain provides a relatively good signal-to-noise ratio. In case a strong signal is present at the input, the amplifier is controlled so as to provide a relatively low gain. In that case, a signal processing chain provides a relatively good signal-to-distortion ratio.

However, there is a drawback when an amplifier with a controllable gain is coupled in front of a signal splitter. The signal splitter will provide output signals whose respective amplitudes depend on the gain of the amplifier, which is controlled in accordance with a certain criterion. This criterion may be suitable for one output signal that the signal splitter provides, but may not be suitable for another output signal. For example, let it be assumed that one output signal is applied to a first tuner and that another output signal is applied to a second tuner. Let it further be assumed that the first tuner is tuned to a certain channel "A" and that the gain of the amplifier is controlled on the basis of the amplitude of a signal in channel A. The second tuner may be tuned to a different channel "B". The amplitude of the signal in channel A will influence the amplitude of a signal in channel B that the second tuner receives. This is generally undesired.

In accordance with the aforementioned aspect of the invention, the controllable-gain circuit provides two pairs of complementary gain-controlled signals, one for the controllable-gain output circuit and the other for the constant gain output circuit. The weighed sum that the controllable-gain output circuit makes, constitutes an output signal whose amplitude depends on the controllable-gain. The weighed sum that the constant-gain output circuit makes, constitutes a further output signal whose amplitude does not substantially depend on the controllable gain.

Accordingly, the signal splitter in accordance with the invention can provide a controllable gain for one signal processing branch and a fixed gain for another signal processing branch. The signal splitter combines two desired properties. One desired property is that the input signal, which is to be splitted, is amplified with a controllable gain. This allows the signal processing branch for which the signal splitter provides the controllable gain, to have satisfactory performance in terms of signal-to-noise and signal-to-distortion ratio. The other desired property is that at least one of the output signals, which result from the signal split, has an amplitude that does not substantially depend on the controllable gain. This allows the other signal processing branch to receive signals that are not influenced by the gain control for the first mentioned signal processing branch. For those reasons, the invention contributes to a satisfactory signal processing performance in applications that require a signal split.

These and other aspects of the invention will be described in greater detail hereinafter with reference to drawings.

DETAILED DESCRIPTION

Figure 1:
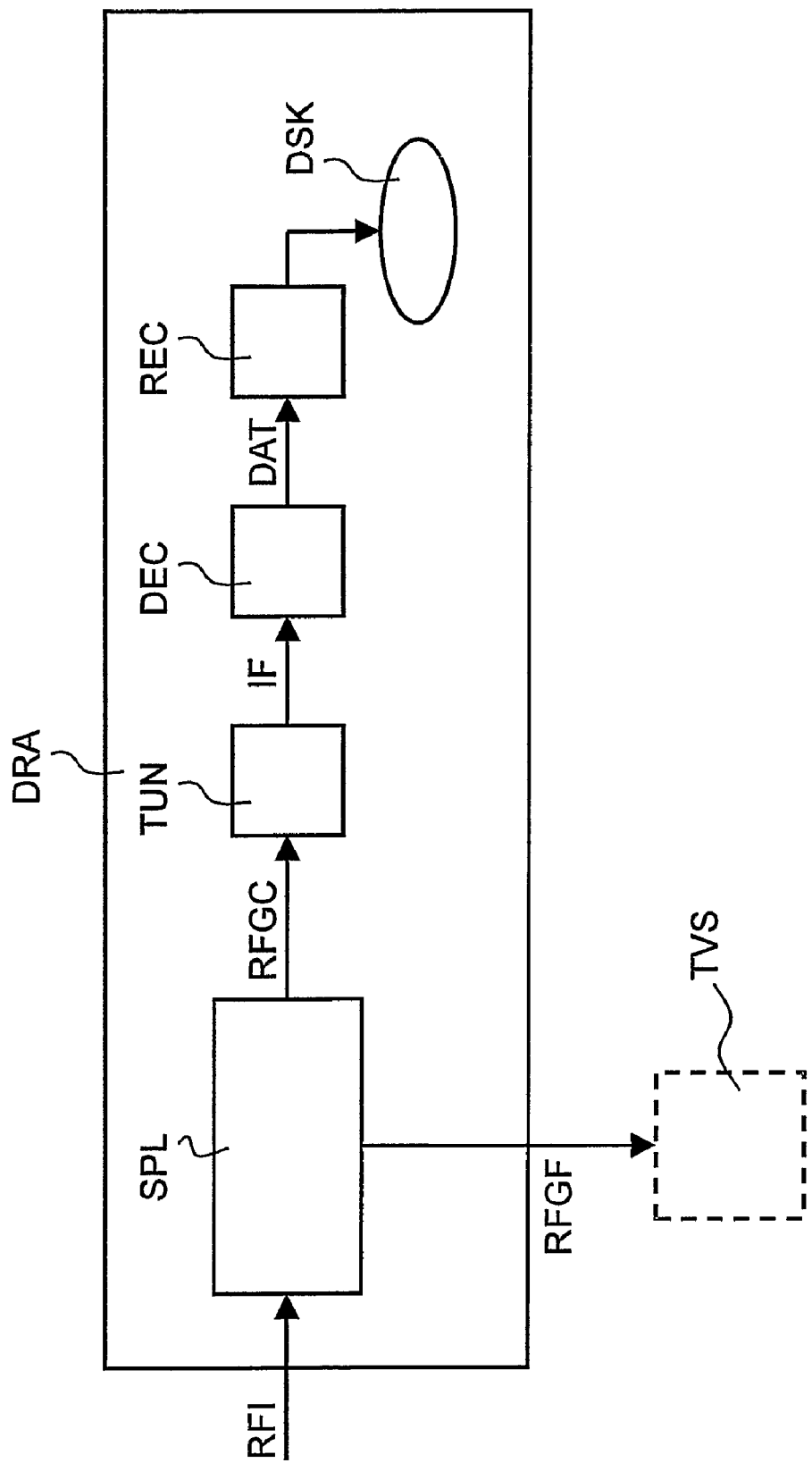
FIG. 1 is a block diagram that illustrates a data recording apparatus.

FIG. 1 illustrates a data recording apparatus DRA, such as, for example, a digital versatile disk (DVD) recorder or a hard disk drive (HDD) recorder, or a combination of both. The data recording apparatus DRA selects a desired signal present within a radiofrequency spectrum RFI received an input. The desired signal conveys data. The data recording apparatus DRA records this data on a disk. The data recording apparatus DRA may be coupled to a television set TVS, which is illustrated by means of broken lines.

The data recording apparatus DRA comprises a signal splitter SPL, a tuner TUN, a decoder DEC, and a recorder REC. The signal splitter SPL amplifies the radiofrequency spectrum RF. The signal splitter SPL provides two output signals: a controllable-gain amplified radiofrequency spectrum RFGC and a fixed-gain amplified radiofrequency spectrum RFGF. The tuner TUN of the data recording apparatus DRA receives the controllable-gain amplified radiofrequency spectrum RFGC. The television set TVS receives the fixed-gain amplified radiofrequency spectrum RFGF. The fixed-gain amplified radiofrequency spectrum RFGF thus constitutes a so-called loop-through signal that may be applied one or more other apparatuses, such as the television set TVS as illustrated in FIG. 1.

The tuner TUN provides an intermediate frequency signal IF in response to the controllable-gain amplified radiofrequency spectrum RFGC. The intermediate frequency signal IF is a frequency-shifted version of the desired signal in the radiofrequency spectrum RFI. Other signals in the radiofrequency spectrum RFI are attenuated to a relatively great extent. The decoder DEC retrieves recordable data DAT from the intermediate frequency signal IF. The recordable data DAT may represent, for example, a movie. The recorder REC records the recordable data DAT on the disk that is present within the data recording apparatus DRA.

Figure 2:
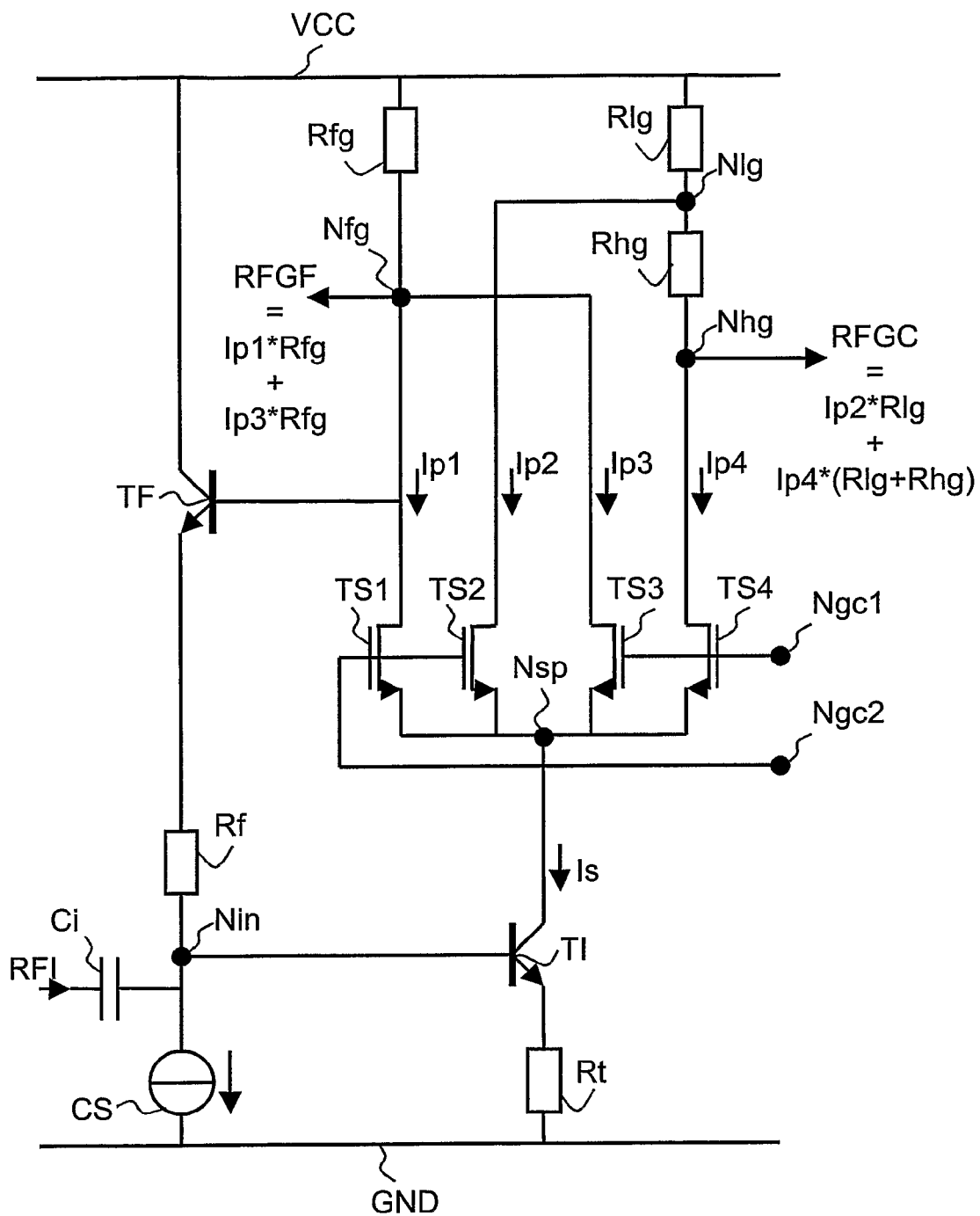
FIG. 2 is a circuit diagram that illustrated a signal splitter that forms part of the data recording apparatus.

FIG. 2 illustrates the signal splitter SPL. The signal splitter SPL comprises an input capacitance Ci, an input transistor TI, a transadmittance resistance Rt, four current-splitter transistors TS1, ..., TS4, a low-gain resistance Rlg, a high-gain resistance Rhg, a fixed-gain resistance Rfg, a feedback transistor TF, a feedback resistance Rf, and a DC current source CS. The signal splitter SPL receives a supply voltage via a positive supply voltage path VCC and a negative supply voltage path GND. The input transistor TI and the feedback transistor TF are preferably bipolar transistors, each having a base, an emitter, and a collector. The four current-splitter transistors TS1, ..., TS4 are preferably MOS transistors, each having a gate, a source, and a drain. The high-gain resistance Rhg preferably has a relatively high value compared with the low-gain resistance Rlg, for example, a value that is an order of magnitude higher.

The signal splitter SPL comprises various nodes: an input node Nin, a current-splitter node Nsp, a pair of gain-control nodes Ngc1, Ngc2, a low-gain node Nlg, a high-gain node Nhg, and a fixed-gain node Nfg. The base of the input transistor TI is coupled to the input node Nin. The respective sources of the four current-splitter transistors TS1, ..., TS4 are coupled to the current-splitter node Nsp. The respective gates of current-splitter transistors TS1 and TS2 are coupled to gain-control node Ngc2, whereas the respective gates of current-splitter transistors TS3 and TS4 are coupled to gain-control node Ngc1. The respective drains of current-splitter transistors TS1 and TS3 are coupled to the fixed-gain node Nfg. The drain of current-splitter transistor TS2 is coupled to the low-gain node Nlg. The drain of current-splitter transistor TS4 is coupled to the high-gain node Nhg.

The low-gain resistance Rlg is coupled between the positive supply voltage path VCC and the low-gain node Nlg. The high-gain resistance Rhg is coupled between the low-gain node Nlg and the high-gain node Nhg. The fixed-gain resistance Rfg is coupled between the positive supply voltage path VCC and the fixed-gain node Nfg. The controllable-gain amplified radiofrequency spectrum RFGC is taken from the high-gain node Nhg. The fixed-gain amplified radiofrequency spectrum RFGF is taken from the fixed-gain node Nfg.

The current splitter illustrated in FIG. 2 operates as follows. The input transistor TI receives the radiofrequency spectrum RFI at its base via the input capacitance Ci. The input transistor TI and the transadmittance resistance Rt constitute a transadmittance stage, which converts the radiofrequency spectrum RFI into a signal current Is. The transadmittance stage has a transadmittance gain, which is a voltage-to-current conversion ratio. The transadmittance gain depends on the value of the transadmittance resistance Rt and a bias current that flows through the input transistor TI. The transadmittance gain is approximately the inverse of the value of the transadmittance resistance Rt (1/Rt) if the bias current causes a voltage drop across the transadmittance resistance Rt that is at least an order of magnitude greater than 25 mV. This will be assumed to be the case hereinafter.

The four current-splitter transistors TS1, ..., TS4 constitute a current splitter, which splits the signal current Is into four portions Ip1, ..., Ip4. The current-splitter node Nsp can be regarded as an input of the current splitter. The drain of each current-splitter transistor TS constitutes an output of the current splitter that provides a particular portion of the signal current Is. Portion Ip1 of the signal current Is at the drain of current-splitter transistor TS1 is substantially equal to portion Ip2 at the drain of current-splitter transistor TS2. Likewise, portion Ip3 of the signal current Is at the drain of current-splitter transistor TS3 is substantially equal to portion Ip4 at the drain of current-splitter transistor TS4. Let it be assumed that portion Ip1 of the signal current Is at the drain of current-splitter transistor TS1 is ½X*Is, X being a current split factor comprised between 0 and 1. In that case, portion Ip2 at the drain of current-splitter transistor TS2 is equally ½X*Is. Portion Ip3 of the signal current Is at the drain of current-splitter transistor TS3 is ½(1−X)*Is. Portion Ip4 at the drain of current-splitter transistor TS4 is equally ½(1−X)*Is.

The current split factor X depends on a gain control voltage that is present between the pair of gain-control nodes Ngc1, Ngc2. For example, let it be assumed that a voltage is present at the gain-control node Ngc2, which is significantly higher than a voltage present at the gain-control node Ngc1. In that case, the current split factor X will be substantially equal to 1: half the signal current Is will flow through current-splitter transistor TS1, the other half will flow through current-splitter transistor TS2. Substantially no current will flow through the current-splitter transistors TS3 and TS4. Let it now be assumed that a voltage is present at the gain-control node Ngc1 which is significantly higher than a voltage present at the gain-control node Ngc2. In that case the current split factor will be substantially equal to 0: half the signal current Is will flow through current-splitter transistor TS3, the other half will flow through current-splitter transistor TS4. Substantially no current will flow through the current-splitter transistors TS1 and TS2.

Portion Ip1 and portion Ip3 of the signal current Is are summed at the fixed-gain node Nfg. The sum of these portions flows through the fixed-gain resistance Rfg. Accordingly, a signal voltage is present at the fixed-gain node Nfg, which is equal to the sum of portions Ip1 and Ip3 multiplied with the value of the fixed-gain resistance Rfg: Ip1*Rfg+Ip3*Rfg. It is recalled that portion Ip1 is equal to ½X*Is and that portion Ip3 is equal to ½(1−X)*Is. The sum of these portions is equal to ½*Is. Accordingly, a signal voltage is present at the fixed-gain node Nfg, which is equal to ½*Is multiplied with the value of the fixed-gain resistance Rfg. The signal current Is is approximately equal to the signal voltage at the input node Nin divided by the value of the transadmittance resistance Rt.

The signal splitter SPL thus provides a fixed gain from the input node Nin to the fixed-gain node Nfg. This fixed gain is approximately half the value of the fixed-gain resistance Rfg divided by the value of the transadmittance resistance Rt: ½Rcg/Rt. Portion Ip4 of the signal current Is flows through the high-gain resistance Rhg, which is coupled between the low-gain node Nlg and the high-gain node Nhg. Consequently, a signal voltage will be present between the low-gain node Nlg and the high-gain node Nhg. This signal voltage is equal to portion Ip4 of the signal current Is multiplied with the value of the high-gain resistance Rhg: Ip4*Rhg. Portion Ip2 and portion Ip4 of the signal current Is are summed at the low-gain node Nlg. The sum of these portions flows through the low-gain resistance Rlg. Accordingly, a signal voltage is present at the low-gain node Nlg, which is equal to the sum of portions Ip2 and Ip4 multiplied with the value of the low-gain resistance Rlg: Ip2*Rlg+Ip4*Rlg.

A signal voltage is present at the high-gain node Nhg. This signal voltage is the sum of the signal voltage present at the low-gain node Nlg and the signal voltage present between the low-gain node Nlg and the high-gain node Nhg: Ip2*Rlg+Ip4*(Rlg+Rhg). It is recalled that portion Ip2 is equal to ½X*Is and that portion Ip4 is equal to ½(1−X)*Is. Accordingly, the signal voltage present at the high-gain node Nhg is ½*Is*Rlg+½(1−X)*Is*Rhg.

The signal splitter SPL thus provides a controllable gain from the input node Nin to the high-gain node Nhg. The controllable gain has a maximum value when the current split factor is equal to 0. The maximum value is approximately half the sum of the value of the high-gain resistance Rhg and the value of the low-gain resistance Rlg divided by the value of the transadmittance resistance Rt: ½(Rhg+Rlg)/Rt. The controllable gain has a minimum value when the current split factor is equal to 1. The minimum value is approximately half the value of the low-gain resistance Rlg divided by the value of the transadmittance resistance Rt: ½Rlg/Rt.

The feedback transistor TF, which constitutes an emitter follower, applies the signal voltage present at the fixed-gain node Nfg to a connection of the feedback resistance Rf. An opposite connection of the feedback resistance Rf is coupled to the input node Nin. The feedback resistance Rf causes an input signal current to flow from the input node Nin to the positive supply voltage path VCC via the feedback transistor TF. This input signal current is approximately equal to the signal voltage present at the fixed-gain node Nfg divided by the value of the feedback resistance Rf. At the frequencies of interest, a short circuit can be considered to exist between the positive supply voltage path VCC and the negative supply voltage path GND, which constitutes signal ground. Consequently, the input signal current that the feedback resistance Rf causes to flow, flows to signal ground. As a result, the feedback resistance Rf substantially determines an input impedance that is present between the input node Nin and signal ground.

Let it be assumed that a signal voltage Vs is present at the input node Nin. In that case, the signal voltage at the fixed-gain node Nfg is the signal voltage Vs multiplied with the fixed gain. The input signal current that the feedback resistance Rf causes to flow is the signal voltage Vs multiplied with the fixed gain and divided by the value of feedback resistance Rf. The input impedance at the input node Nin is approximately equal to the signal voltage Vs divided by the input signal current. The input impedance is thus the value of feedback resistance Rf divided by the fixed gain.

Consequently, it is possible to obtain a suitable input impedance, such as, for example, 50 or 75 Ohm, with a relatively high value of the feedback resistance Rf. A relatively high value of the feedback resistance Rf allows relatively low noise. This is particularly true compared with a solution wherein a suitable input impedance is achieved by simply coupling an input resistance between an input node Nin and signal ground.

CONCLUDING REMARKS

The detailed description hereinbefore with reference to the drawings illustrates the following characteristics. A controllable-gain circuit provides a first and a second pair of complementary gain-controlled signals in response to an input signal (radiofrequency spectrum RFI forms the input signal; input transistor TI, transadmittance resistance Rt, and current-splitter transistors TS1, . . . , TS4 form a controllable-gain circuit; portions Ip1 and Ip3 constitute the first pair of complementary gain-controlled signals, portions Ip2 and Ip4 constitute the second pair). In each pair, one gain-controlled signal is the input signal amplified with a gain G comprised in a range between a minimum gain Gmin and a maximum gain Gmax (the gain is ½Rt*X for Ip1 and Ip2, X being controllable between 0 and 1). The other gain-controlled signal is the input signal amplified with complementary gain Gmax-G (the gain is ½Rt*(1−X) for Ip3 and Ip4). A fixed-gain output circuit makes a weighed sum of one and the other gain-controlled signal in the first pair of complementary gain-controlled signals (fixed-gain resistance Rfg and fixed-gain node Nfg make a weighed sum of Ip1 and Ip3: Ip1*Rfg+Ip3*Rfg). The respective weighing factors for one and the other gain-controlled signal are substantially similar (Rfg is the weighing factor both for Ip1 and Ip3). A controllable-gain output circuit makes a weighed sum of one and the other gain-controlled signal in the second pair of complementary gain-controlled signals (low-gain resistance Rlg, high-gain resistance Rhg, low-gain node Nlg, and high gain node Nhg make a weighed sum of Ip2 and Ip4: Ip2*Rlg+Ip4*(Rlg+Rhg)). The respective weighing factors for one and the other gain-controlled signal are substantially different (Rlg is the weighing factor for Ip2, Rlg+Rhg is the weighing factor for Ip4).

The detailed description hereinbefore further illustrates the following optional characteristics. The gain-controllable circuit comprises a transadmittance circuit (input transistor TI, transadmittance resistance Rt) for providing a signal current (Is) in response to the input signal (radiofrequency spectrum RFI). The gain-controllable circuit further comprises a current splitter (current splitting transistors TS1, . . . , TS4) for splitting the signal current (Is) into four portions (Ip1, . . . , Ip4), two of which (Ip1, Ip3) constitute the first pair of complementary gain-controlled signals, the other two portions (Ip2, Ip4) constituting the second pair of complementary gain-controlled signals. These characteristics further contribute to a satisfactory signal processing performance because current splitting introduces relatively little distortion.

The detailed description hereinbefore further illustrates the following optional characteristics. The current splitter comprises four transistors (TS1, . . . , TS4) each of which has an input current connection (source) and a current control connection (gate), the respective input current connections being coupled to an input current node (current-splitter node Nsp) coupled to receive the signal current (Is) from the transadmittance circuit (input transistor TI, transadmittance resistance Rt), the respective current control connections of two of the four transistors (T1, T2) being coupled to a gain-control node (Ngc2), the respective current control terminals of the other two of the four transistors (T3, T4) being coupled to another gain-control node (Ngc1). These characteristics allow a continuous gain control with relatively few components: a voltage between the gain-control nodes determines the gain.

The detailed description hereinbefore further illustrates the following optional characteristics. The fixed-gain output circuit comprises a fixed-gain resistance (Rfg) coupled between a supply voltage path (VCC) and a fixed-gain node (Nfg), which is coupled to receive one and the other gain-controlled signal of the first pair of complementary gain-controlled signals (Ip1, Ip3). This allows cost-efficient implementations because relatively few components are required.

The detailed description hereinbefore further illustrates the following optional characteristics. The controllable-gain output circuit comprises a low-gain and a high-gain resistance Rhg (Rlg, Rhg), the low-gain resistance (Rlg) being coupled between a supply voltage path (VCC) and a low-gain node (Nlg), which is coupled to receive one gain-controlled signal (Ip2) of the second pair of complementary gain-controlled signals (Ip2, Ip4), the high-gain resistance Rhg (Rhg) being coupled between the low-gain node and a high-gain node (Nhg), which is coupled to receive the other gain-controlled signal (Ip4) of the second pair of complementary gain-controlled signals. This allows cost-efficient implementations because relatively few components are required.

The detailed description hereinbefore further illustrates the following optional characteristics. The signal splitter comprises a feedback resistance (Rf) coupled between an input node (Nin), which is coupled to receive the input signal (RFI), and an output connection (Nfg) of the fixed-gain circuit (Rcg, Ncg), which is coupled to provide the weighed sum (Ip1*Rfg+Ip3*Rfg) of one and the other gain-controlled signal in the second pair of complementary gain-controlled signals (Ip1, Ip3). This allows a suitable input impedance with relative low noise.

The aforementioned characteristics can be implemented in numerous different manners. In order to illustrate this, some alternatives are briefly indicated. The controllable-gain circuit may be implemented, for example, by means of four individual amplifiers, each of which provides a particular gain-controlled signal. Each amplifier may comprise, for example, a transistor whose base receives the input signal and whose emitter is coupled to signal ground via a relatively low impedance. A bias current that flows through the transistor will determine the gain. Accordingly, a suitable gain and complementary gain can be achieved by suitably controlling the respective bias currents. For example, the bias currents may be derived from a single current source whose output current splits into four portions, each portion constituting a bias current for a particular transistor.

There are numerous manners to split a current. The description hereinbefore is an example of an amplitude-continuous approach. It is also possible to split a current in discrete steps. A digital control value may determine the current split, which may be switched between, for example, current split factors 0, ¼, ½, ¾, and 1. There are numerous manners make a weighed sum of signals. The description hereinbefore is an example of a current-based approach, wherein resistances constitute weighing factors. It is also possible, for example, to implement one or more output amplifiers that make a weighed combination. In such an approach, an amplifier gain may constitute a weighing factor.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A signal splitter comprising:
   a gain-controllable circuit arranged to provide a first and a second pair of complementary gain-controlled signals in response to an input signal wherein in each pair a first said gain-controlled signal is the input signal amplified with a gain G comprised in a range between a minimum gain Gmin and a maximum gain Gmax, and a second said gain-controlled signal is the input signal amplified with a complementary gain Gmax-G;
   a fixed-gain output circuit arranged to make a weighed sum of said gain-controlled signals in the first pair of complementary gain-controlled signals wherein respective weighing factors for said gain-controlled signals are substantially similar; and
   a controllable-gain output circuit arranged to make a weighed sum of said gain-controlled signals in the second pair of complementary gain-controlled signals wherein respective weighing factors, for said gain-controlled signals are substantially different.

2. A signal splitter as claimed in claim 1, wherein the gain-controllable circuit comprises:
   a transadmittance circuit for providing a signal current in response to the input signal and
   a current splitter for splitting the signal current into four portions two of which constitute the first pair of complementary gain-controlled signals, the other two portions constituting the second pair of complementary gain-controlled signals.

3. A signal splitter claimed in claim 2, wherein the current splitter comprises four transistors each of which has an input current connection and a current control connection, the respective input current connections being coupled to an input current node coupled to receive the signal current from the transadmittance circuit, the respective current control connections of two of the four transistors being coupled to a gain control node, the respective current control connections of the other two of the four transistors being coupled to another gain control node.

4. A signal splitter as claimed in claim 2, wherein the fixed-gain output circuit comprises a fixed-gain resistance coupled between a supply voltage path and a fixed-gain node which is coupled to receive said gain-controlled signals of the first pair of complementary gain-controlled signals.

5. A signal splitter claimed in claim 2, wherein the controllable-gain output circuit comprises a low-gain resistance Rlg and a high-gain resistance Rhg the low-gain resistance Rlg being coupled between a supply voltage path and a low-gain node, which is coupled to receive said gain-controlled signal of the second pair of complementary gain-controlled signals the high-gain resistance Rhg being coupled between the low-gain node and a high-gain node which is coupled to receive said gain-controlled signal of the second pair of complementary gain-controlled signals.

6. A signal splitter as claimed in claim 1, wherein the signal splitter comprises a feedback resistance coupled between an input node which is coupled to receive the input signal and an output node of the fixed-gain output circuit which is coupled to provide the weighed sum of said gain-controlled signals in the second pair of complementary gain-controlled signals.

7. A method of splitting a signal the method comprising:
a gain-control step in which a first and a second pair of complementary gain-controlled signals are provided in response to an input signal wherein in each pair a first said gain-controlled signal is the input signal amplified with a gain G comprised in a range between a minimum gain Gmin and a maximum gain Gmax, and a second said gain-controlled signal is the input signal amplified with a complementary gain Gmax-G;
a fixed-gain output step in which a weighed sum is made of said gain-controlled signals in the first pair of complementary gain-controlled signals wherein respective weighing factors for said gain-controlled signals are substantially similar; and
a controllable-gain output step in which a weighed sum is made of said gain-controlled signals in the second pair of complementary gain-controlled signals wherein respective weighing factors for said gain-controlled signals are substantially different.

8. A signal processing arrangement comprising a signal splitter as claimed in claim 1, and a signal processing circuit for processing an output signal of the signal splitter.

9. An information-recording apparatus comprising a signal splitter as claimed in claim 1, a signal processing circuit for processing an output signal of the signal splitter so as to obtain a recordable signal and a recorder for recording the recordable signal on a recording medium.

* * * * *